(12) United States Patent
Ezzendine

(10) Patent No.: US 7,511,591 B2
(45) Date of Patent: Mar. 31, 2009

(54) SETTING OF THE IMPEDANCE RATIO OF A BALUN

(75) Inventor: Hilal Ezzendine, Tours (FR)

(73) Assignee: STMicroelectronics S.A., Montrouge (FR)

( * ) Notice: Subject to any disclaimer, the term of this patent is extended or adjusted under 35 U.S.C. 154(b) by 116 days.

(21) Appl. No.: 11/258,562

(22) Filed: Oct. 25, 2005

(65) Prior Publication Data

US 2006/0087384 A1    Apr. 27, 2006

(30) Foreign Application Priority Data

Oct. 25, 2004    (FR)    .................................. 04 52431

(51) Int. Cl.
*H03H 7/42* (2006.01)
*H01F 5/00* (2006.01)
(52) U.S. Cl. .......................................... 333/26; 333/25
(58) Field of Classification Search .................. 333/25, 333/26
See application file for complete search history.

(56) References Cited

U.S. PATENT DOCUMENTS

| 5,886,589 | A | 3/1999 | Mourant |
| 6,396,362 | B1 * | 5/2002 | Mourant et al. ................ 333/25 |
| 2002/0171529 | A1 | 11/2002 | Tang |
| 2004/0130427 | A1 | 7/2004 | Ezzeddine |

FOREIGN PATENT DOCUMENTS

EP    1416575 A1 *   10/2003

OTHER PUBLICATIONS

French Search Report from French Patent Application No. 04/52431, filed Oct. 25, 2004.

* cited by examiner

*Primary Examiner*—Dean O Takaoka
(74) *Attorney, Agent, or Firm*—Lisa K. Jorgenson; James H. Morris; Wolf, Greenfield & Sacks, P.C.

(57) ABSTRACT

The modification of the impedance ratio of a balun of four conductive windings formed in two metallization planes stacked by being interdigited and electrically in series two by two, by connecting a capacitor in series with the two windings defining the common mode of the balun.

19 Claims, 3 Drawing Sheets

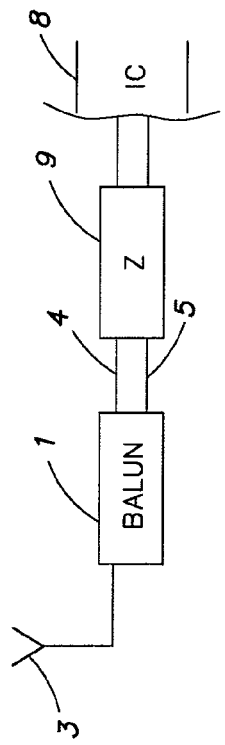
FIG. 3 - Prior Art -
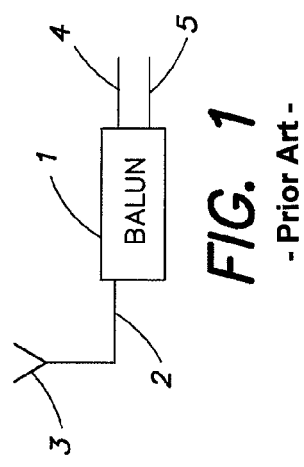
FIG. 1 - Prior Art -
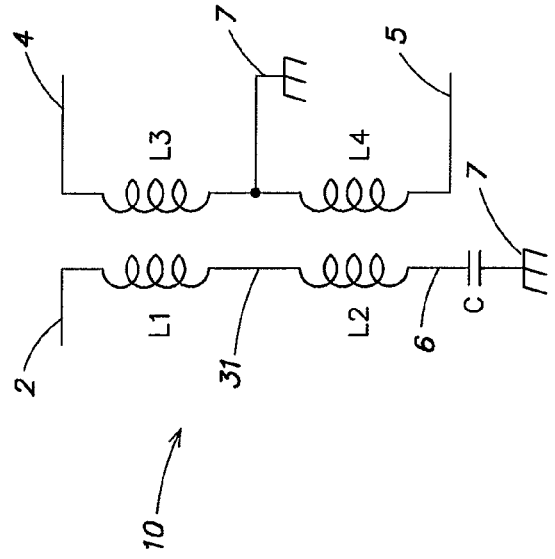
FIG. 6
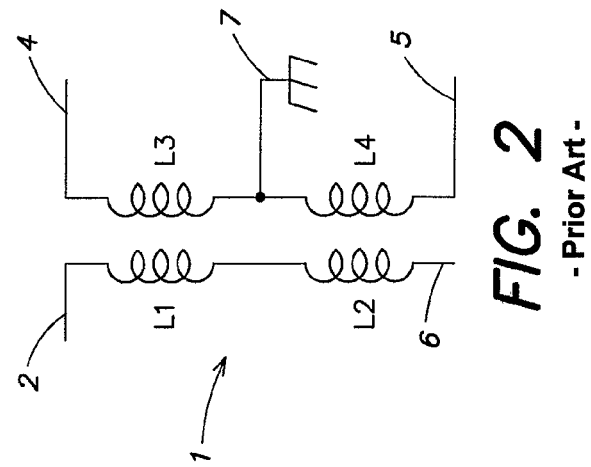
FIG. 2 - Prior Art -

SETTING OF THE IMPEDANCE RATIO OF A BALUN

BACKGROUND OF THE INVENTION

1. Field of the Invention

The present invention relates to the field of mode-switching transformers, generally called baluns (for balance-unbalance). Such transformers are intended to convert a common-mode signal (referenced to ground) into a differential mode signal and conversely, and to avoid disturbances introduced by a ground plane of the circuit, a parasitic coupling, etc.

An example of application of baluns of the type to which the present invention applies relates to baluns equipping portable phones which convert the signals received by the telephone antenna into signals exploitable by its circuits and, in the reverse direction, of enabling transmission of signals by the antenna.

2. Discussion of the Related Art

FIG. 1 very schematically shows the block diagram of a balun 1 and FIG. 2 shows its equivalent electric diagram.

This transformer comprises a common-mode access 2, generally connected to an antenna 3, and two differential mode accesses 4 and 5 intended to be connected to circuits for processing received signals or signals to be transmitted. Electrically, transformer 1 is equivalent to four inductances L1, L2, L3, and L4 (FIG. 2) associated in series two by two, each inductance of a branch (common mode or differential mode) being coupled to an inductance of the other branch. For example, two inductances L1 and L2 are in series between common-mode access 2 and an access 6 generally left in the air. Two inductances L3 and L4 are in series between differential-mode accesses 4 and 5, their junction point being generally connected to ground 7.

Baluns are distributed in three categories. A first category relates to so-called distributed baluns formed of transmission lines coupled to one another. A second category relates to so-called active baluns formed of transistors. A third category relates to so-called baluns with local elements formed of inductive elements and possible discrete capacitive elements. The present invention relates to distributed baluns of the first category.

Distributed baluns are generally formed by means of conductive tracks deposited on a substrate. These tracks have the shape of planar windings forming the inductive elements and have lengths which are a function, especially, of the operating frequency range desired for the balun. The present invention more specifically relates to so-called Marchand-type baluns, the conductive windings of which have lengths which are a function of the quarter of the wavelength corresponding to the central frequency of the passband desired for the balun.

A problem which is posed in the assembly of a balun in the radiofrequency transceiver chain for which it is intended originates from the impedance matching between the different elements.

FIG. 3 shows a conventional example of the assembly of a balun 1 such as described previously in its application environment. Differential-mode accesses 4 and 5 are intended to be connected to input-output terminals of a circuit 8 (IC), generally, an integrated circuit of exploitation and generation of the communication signals. The connection between balun 1 and circuit 8 is generally performed via at least one impedance matching element 9 (Z) and, possibly, a filter (not shown). For simplification, ground 7 has not been shown in FIG. 3.

Impedance matching element 9 has a unity impedance ratio (for example, 50 ohms/50 ohms, 200 ohms/200 ohms, etc.) or not (for example, 50 ohms/100 ohms, 400 ohms/75 ohms, etc.) according to the needs of the application.

The insertion of an impedance matching element between the balun and the circuits exploiting its signals adversely affects the need to miniaturize electronic circuits. It would thus be desirable to be able to combine them.

However, balun sizing aims are a priori incompatible with those of an impedance matcher, especially for distributed baluns. In particular, in a distributed balun of the type to which the present invention applies, the respecting of the winding lengths according to one quarter of the wavelength is necessary for to the proper operation of the balun. If this may be convenient for a unity impedance ratio, a non-unity impedance ratio generally requires inductive elements of values different from one another. It has been envisaged to increase the number of spirals on one side with respect to the other of the transformer (of one branch with respect to the other), which causes an increase in the inductances on one side with respect to the other, and thus a change in the impedance ratio. Such a solution is however incompatible with the proper operation of a distributed balun since the number of spirals must preferentially be the same on the common mode side and on the differential mode side to comply with the other balun characteristics.

SUMMARY OF THE INVENTION

The present invention aims at providing a balun of distributed type with a non-unity impedance ratio.

The present invention also aims at providing a solution which enables modifying the impedance ratio without adversely affecting the transformer operation.

The present invention also aims at providing an integrable balun with a non-unity impedance ratio.

The present invention further aims at providing a balun structure in which the change of the impedance ratio between two baluns requires few modifications.

To achieve these and other objects, the present invention provides a balun of distributed type, formed of planar conductive windings defining inductive elements comprising:

in a first conductive level, a first winding between a first common-mode access and a first central end and a second winding between a first differential-mode access and a second central end;

in a second conductive level, a third winding having a central end electrically connected to the first central end of the first level and having an external end defining a second common-mode access, and a fourth winding having an external end defining a second differential-mode access and having a central end electrically connected to the second central end of the first level; and a third conductive level forming a ground plane to which are electrically connected the central interconnected ends of the second and fourth differential-mode windings, the external end of the third winding being electrically connected to a surface defining a first electrode of a capacitor having a second electrode connected to the ground plane, and the value of the capacitor being selected according to the impedance ratio desired for the transformer.

According to an embodiment of the present invention, all the conductive windings have the same dimensions, selected according to the central operating frequency desired for the transformer.

According to an embodiment of the present invention, the second electrode of the capacitor is formed directly by the ground plane.

The present invention also provides a method for modifying the impedance ratio of a balun with four conductive windings formed in two metallization planes stacked by being interdigited and electrically in series two by two, comprising connecting a capacitor in series with the two windings defining the common mode of the transformer.

The foregoing and other objects, features, and advantages of the present invention will be discussed in detail in the following non-limiting description of specific embodiments in connection with the accompanying drawings.

BRIEF DESCRIPTION OF THE DRAWINGS

FIGS. 1 to 3, previously described, are intended to show the state of the art and the problem to solve;

FIG. 6 shows the equivalent electric diagram of the balun of FIGS. 4 and 5.

DETAILED DESCRIPTIONS

Figure 4:
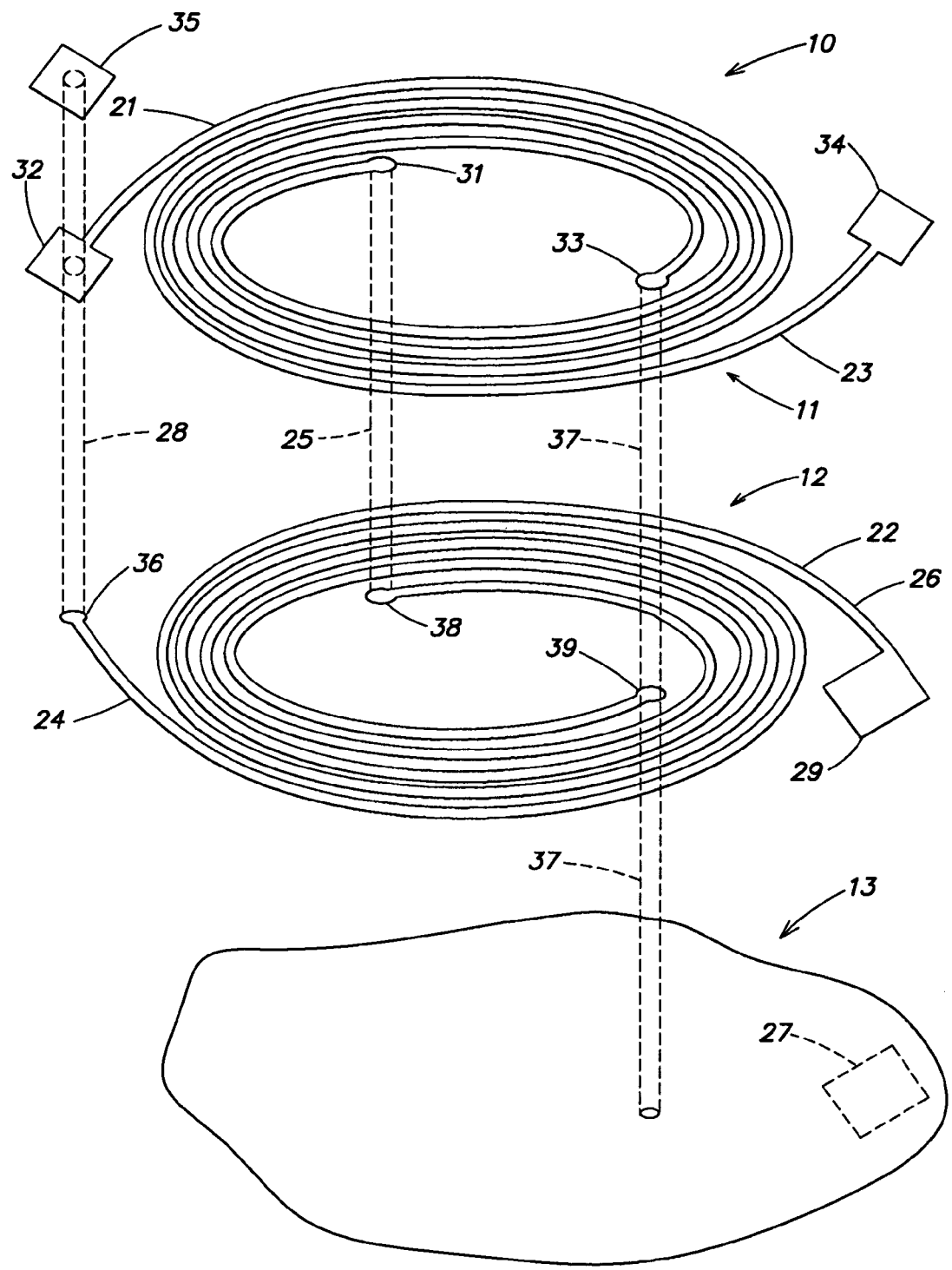
FIG. 4 is an exploded perspective view of the different layers constitutive of a balun according to a preferred embodiment of the present invention.

The same elements have been designated with the same reference numerals in the different drawings, which have been drawn out of scale. For clarity, only those elements which are necessary to the understanding of the present invention have been shown in the drawings and will be described hereafter. In particular, the circuits connected upstream and downstream of a balun according to the present invention have not been described in detail, the present invention being compatible with any conventional use of such a transformer.

A feature of the present invention is to form the balun as stacked conductive windings interdigited two by two, preferably all of same lengths selected according to the passband desired for the balun, and to provide a capacitor in series with the common-mode windings to set the impedance ratio of the transformer.

FIG. 4 very schematically shows in an exploded perspective view an embodiment of a balun according to the present invention.

Figure 5:
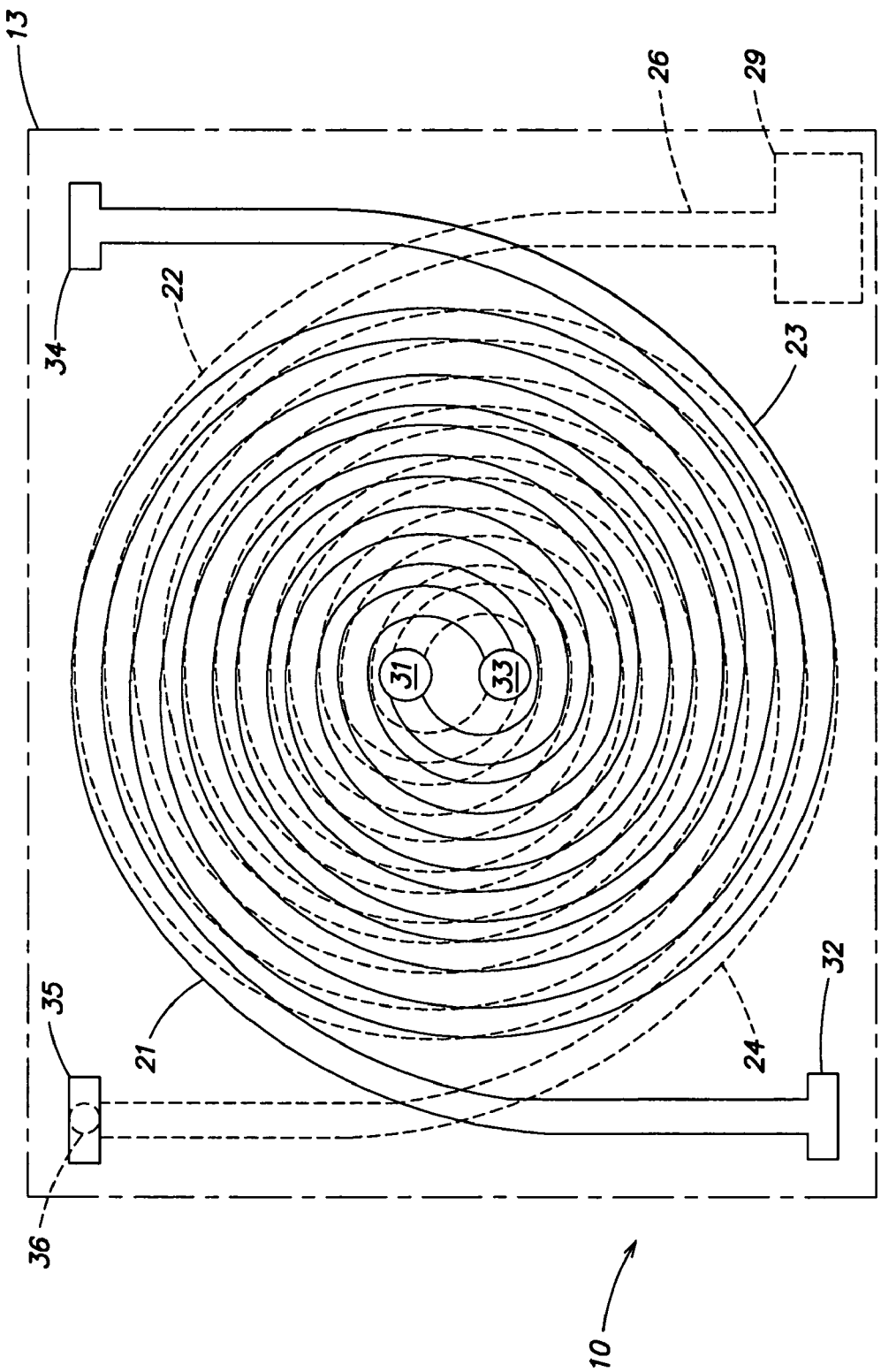
FIG. 5 is a top view of the balun of FIG. 4.

This drawing will be described at the same time as FIG. 5, which is a top view of the balun of FIG. 4 and as FIG. 6, which shows its equivalent electric diagram.

Transformer 10 according to the present invention comprises four inductive spirals (inductances L1, L2, L3, and L4, FIG. 6), each formed of a planar winding 21, 22, 23, or 24 (FIGS. 4 and 5) of a conductive line. These four planar windings are formed in two conductive levels 11 and 12 (FIG. 5) separated from each other by an insulating material (not shown). A third conductive level 13 (for example, lower) is used as a ground plane.

In the example shown in the drawings, a first inductance L1 of the common-mode branch (also designated as the transformer primary) is formed by planar conductive winding 21 in first level 11 (arbitrarily greater) between an external pad 32 forming common-mode access 2 of the balun and a central end 31 to be connected to inductance L2. For example, winding 21 winds clockwise from the outside to the inside.

Inductance L1 is coupled with a first inductance L3 of the differential branch (also designated as the transformer secondary), formed of planar conductive winding 23 formed in first level 11 by being interdigited with winding 21. Thus, winding 23 also winds clockwise between an external pad 34 defining differential-mode access 4 (FIG. 6) and a central end 33 intended to be connected to ground 7.

On the differential mode side, end 33 of insulator 23 is connected, by a via 37 crossing the insulator between levels 11 and 12, to central end 39 of conductive winding 24 formed in second level 12 and defining inductance L4. Winding 24 winds clockwise from its central end 39 to an external end 36. Respective ends 33 and 39 of windings 23 and 24 are further connected by an extension of via 37 up to third conductive level 13 to a ground plane of the structure formed by this level. External end 36 of winding 24 is, for example, for contact recovery means, transferred to first level 11 by a via 28, to a pad 35 defining differential mode access 5. Other levels may be present above the structure and the contacts are, if necessary, transferred thereto.

On the common mode side, central end 31 of winding 21 is connected, by a via 25 crossing the insulator between the two levels 11 and 12, to central end 38 of planar winding 22 formed in second level 12. Winding 22 defines inductance L2 and winds clockwise from its central end 38 to an external end 26 defining the end of inductance L2.

According to the present invention, a capacitive element C is formed at end 26 of winding 22. This capacitive element is, for example, formed of a surface 29 (for example, rectangular or square) defining a first electrode of capacitor C in level 12. The second electrode of capacitor C is directly formed by the ground plane of level 13 (its second electrode is symbolized by dotted lines 27 above surface 29).

The presence of capacitor C enables, according to the present invention, changing the impedance ratio between the common-mode and differential-mode accesses, without modifying the operation frequency of the balun.

Surprisingly, the present inventor has discovered that while the presence of a capacitor in series with the common-mode access in a balun formed of planar non-superposed windings shifts the operating frequency of the balun to a lower frequency without modifying the impedance ratio, the fact of stacking up the spirals as provided by the present invention does not modify the frequency and changes the impedance ratio.

The dimensions to be given to windings 21, 22, 23, and 24 depend on the central frequency of the passband desired for the balun. Conventionally, the insulator thickness between levels 11 and 12 conditions the coupling between the common and differential modes.

According to the present invention, the value of capacitance C is selected according to the impedance ratio desired for the transformer.

As a specific example of embodiment, a balun intended for a 2-GHz frequency has been formed with planar windings of 2.5 turns. The impedance ratio of this balun is of 50/100 with a 12-pF capacitor taking up a 0.02-mm$^2$ surface area, and is of 50/200 with a 0.5-pF capacitor taking up a 0.01-mm$^2$ surface area.

Other conductive and insulating levels may be present between levels 12 and 13. The second electrode of capacitor C can then be formed in one of the intermediary levels and be connected by a via to the ground plane. As an alternative, the capacitor is a multiple-layer, or additional insulator levels increase the dielectric thickness between the two electrodes illustrated in the drawings.

An advantage of the present invention is that, without modifying the dimensions of the windings forming the mode-switching transformer, its impedance ratio is modified by simply modifying the value of capacitor C defined by surface 29 in metallization level 12.

Another advantage of the present invention is that the presence of capacitor C does not alter the balun performance in the desired operating frequency band defined by the length of the inductive windings which are a function of one quarter of the wavelength.

Another advantage of the present invention is that it reduces the global surface area taken up by a balun and an impedance matching element.

Of course, the present invention is likely to have various, alterations, improvements, and modifications which will readily occur to those skilled in the art. In particular, the dimensions to be given to the inductive windings and to the definition surface of the capacitor are within the abilities of those skilled in the art based on the functional indications given hereabove and on the definition and simulation tools used to dimension baluns. Further, if the forming of circular windings and of a capacitor of square surface area is a preferred embodiment, other shapes are possible, provided to respect the balun character. Further, the manufacturing of a balun of the present invention by using conventional techniques in electronic of conductive depositions and of multiple-layer circuits is within the abilities of those skilled in the art.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A balun of distributed type, formed of planar conductive windings defining inductive elements comprising:
   in a first conductive level, a first winding between a first common-mode access and a first central end and a second winding between a first differential-mode access and a second central end;
   in a second conductive level, a third winding having a central end electrically connected to the first central end of the first level and having an external end defining a second common-mode access, and a fourth winding having an external end defining a second differential-mode access and having a central end electrically connected to the second central end of the first level; and
   a third conductive level forming a ground plane to which are electrically connected the central interconnected ends of the second and fourth differential-mode windings,
   the external end of the third winding being electrically connected to a surface defining a first electrode of a capacitor having a second electrode connected to the ground plane, and the value of the capacitor being selected according to the impedance ratio desired for the transformer.

2. The transformer of claim 1, wherein all the conductive windings have same dimensions, selected according to the central operating frequency desired for the transformer.

3. The transformer of claim 1, wherein the second electrode of the capacitor is formed directly by the ground plane.

4. A distributed balun, comprising:
   a first winding formed in a first level;
   a second winding formed in the first level and interdigitated with the first winding;
   a third winding formed in a second level;
   a fourth winding formed in the second level and interdigitated with the third winding; and
   a capacitor coupled to the third winding and having a value selected to establish a desired impedance ratio for the balun;
   wherein the value of the capacitor is selected such that the distributed balun has a non-unity impedance ratio.

5. The distributed balun of claim 4, wherein the first, second, third and fourth windings are aligned with one another so as to form a single stack.

6. A distributed balun, comprising:
   a first winding formed in a first level;
   a second winding formed in the first level and interdigitated with the first winding;
   a third winding formed in a second level;
   a fourth winding formed in the second level and interdigitated with the third winding, wherein the second winding is connected in series with the fourth winding;
   a capacitor coupled to the third winding and having a value selected to establish a desired impedance ratio for the balun; and
   a ground plane connected to the second and fourth windings at a node connecting the second and fourth windings, the ground plane being formed in a third level different from the first and second levels.

7. The distributed balun of claim 6, wherein a first electrode of the capacitor is formed in the second level and the ground plane provides a second electrode of the capacitor.

8. The distributed balun of claim 6, wherein the second and fourth windings are connected by a via that extends between a central portion of the second winding and a central portion of the fourth winding.

9. The distributed balun of claim 6, wherein the first and third windings are connected in series by a via that extends between a central portion of the first winding and a central portion of the third winding.

10. The distributed balun of claim 6, further comprising an insulator that separates the first level from the second level, wherein a thickness of the insulator separating the first and second levels has no substantial effect on a coupling between common and differential modes of the distributed balun.

11. The distributed balun of claim 6, wherein the distributed balun is of Marchand-type.

12. The distributed balun of claim 6, wherein the value of the capacitor is selected such tat the distributed balun has a non-unity impedance ratio.

13. The distributed balun of claim 6, wherein the distributed balun is configured such that the value of the capacitor has no substantial effect on a central frequency of operation of the distributed balun.

14. The distributed balun of claim 6, wherein the first, second, third and fourth windings are aligned with one another so as to form a single stack.

15. The distributed balun of claim 14, wherein the first winding comprises a first common-mode access terminal, the second winding comprises a first differential-mode access terminal, the third winding comprises a second common-mode access terminal and the fourth winding comprises a second differential-mode access terminal.

16. A distributed balun, comprising:
   a first winding formed in a first level;
   a second winding formed in the first level and interdigitated with the first winding;
   a third winding formed in a second level;
   a fourth winding formed in the second level and interdigitated with the third winding; and
   a capacitor having a value selected to establish a desired impedance ratio for the balun, the capacitor being coupled to the third winding;
   wherein the first, second, third and fourth windings are arranged in a single stack.

17. The distributed balun of claim 16, wherein the first winding comprises a first common-mode access terminal, the second winding comprises a first differential-mode access terminal, the third winding comprises a second common-mode access terminal and the fourth winding comprises a second differential-mode access terminal.

18. The distributed balun of claim 16, wherein the first winding is connected in series with the third winding and the second winding is connected in series with the fourth winding.

19. The distributed balun of claim 16, wherein first level comprises a first metallization level of an integrated circuit and the second level comprises a second metallization level of the integrated circuit.

* * * * *

UNITED STATES PATENT AND TRADEMARK OFFICE
CERTIFICATE OF CORRECTION

PATENT NO. : 7,511,591 B2  Page 1 of 1
APPLICATION NO. : 11/258562
DATED : March 31, 2009
INVENTOR(S) : Hilal Ezzeddine It is certified that error appears in the above-identified patent and that said Letters Patent is hereby corrected as shown below:

Claim 7, col. 6, line 38 should read:
the capacitor is selected such that the distributed balun has a Signed and Sealed this Twelfth Day of May, 2009

JOHN DOLL
*Acting Director of the United States Patent and Trademark Office*